(12) United States Patent
Yamada et al.

(10) Patent No.: US 7,071,722 B2
(45) Date of Patent: Jul. 4, 2006

(54) ANISOTROPIC, CONDUCTIVE SHEET AND IMPEDANCE MEASURING PROBE

(75) Inventors: Daisuke Yamada, Saitama (JP); Kiyoshi Kimura, Saitama (JP); Naoshi Yasuda, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/525,024

(22) PCT Filed: Aug. 26, 2003

(86) PCT No.: PCT/JP03/10748

§ 371 (c)(1),
(2), (4) Date: Feb. 18, 2005

(87) PCT Pub. No.: WO2004/021018

PCT Pub. Date: Mar. 11, 2004

(65) Prior Publication Data

US 2006/0006884 A1   Jan. 12, 2006

(30) Foreign Application Priority Data

Aug. 27, 2002   (JP) .............................. 2002-247757

(51) Int. Cl.
*G01R 31/26* (2006.01)
(52) U.S. Cl. ...................... 324/765; 324/754; 324/761
(58) Field of Classification Search ................ 324/724, 324/754, 761, 765
See application file for complete search history.

(56) References Cited

U.S. PATENT DOCUMENTS 6,663,799 B1* 12/2003 Kokubo et al. .............. 252/512
6,720,787 B1*  4/2004 Kimura et al. ............... 324/765
6,798,212 B1*  9/2004 Stierman et al. ............ 324/534

FOREIGN PATENT DOCUMENTS

| JP | 3-282265    | 12/1991 |
| JP | 8-110366    |  4/1996 |
| JP | 2001-91578  |  4/2001 |
| JP | 2001-235492 |  8/2001 |
| JP | 2001-296314 | 10/2001 |
| JP | 2001-326004 | 11/2001 |

* cited by examiner

*Primary Examiner*—Walter Benson
(74) *Attorney, Agent, or Firm*—Oblon, Spivak, McClelland, Maier & Neustadt, P.C.

(57) ABSTRACT

An anisotropically conductive sheet of the invention formed by containing conductive particles exhibiting magnetism in a sheet base composed of an elastic polymeric substance in a state dispersed in a plane direction thereof and oriented so as to align in a thickness-wise direction thereof. A thickness of the sheet is 10 to 100 μm, a number average particle diameter of the conductive particles exhibiting magnetism is 5 to 50 μm, a ratio $W_1/D$ of the thickness $W_1$ to the number average particle diameter D of the conductive particles exhibiting magnetism is 1.1 to 10, a content of the conductive particles exhibiting magnetism is 10 to 40% in terms of a weight fraction.

5 Claims, 6 Drawing Sheets

ANISOTROPIC, CONDUCTIVE SHEET AND IMPEDANCE MEASURING PROBE

TECHNICAL FIELD

The present invention relates to an anisotropically conductive sheet suitable for use in measurement of characteristic impedance of a printed wiring circuit in a printed wiring board in a high-frequency region or measurement of electrical properties of a high-frequency semiconductor device, and an impedance-measuring probe using the anisotropically conductive sheet.

BACKGROUND ART

With the improvement in the processing speed of computers or the like, in recent years, a clock frequency of CPU (central processing unit) and an operating clock frequency of CPU for reciprocating with external apparatus or devices have markedly increased.

The operating clock frequency increases as described above, whereby requirements for the performance of a printed wiring board for transmitting data signals between CPU and the external apparatus become severe.

More specifically, in a printed wiring board, it is required to match the characteristic impedance of a printed wiring circuit formed by a signal conductor to the characteristic impedance of another printed wiring circuit electrically connected to this printed wiring circuit or to match the characteristic impedance of a printed wiring circuit to the impedance of a circuit load electrically connected to this printed wiring circuit.

When mismatching is present between the characteristic impedances of printed wiring circuits electrically connected to each other or between the characteristic impedance of a printed wiring circuit and the impedance of a circuit load electrically connected to this printed wiring circuit, a part of data signals are reflected into a signal-transmitting source, whereby a signal finally directing to a circuit load is weakened to cause a problem that there is a possibility that transmission of desired data signals may not become infeasible. Such a problem becomes more marked to an unnegligible level as the operating clock frequency becomes higher.

It is thus indispensable to measure the characteristic impedance of a printed wiring circuit in a printed wiring board for the purpose of retaining the quality of the printed wiring board, and quality inspection of the printed wiring board is conducted on the basis of the measured result thereof.

A TDR (time domain refrectrometry) method has heretofore been used for measuring the impedance of a printed wiring circuit in a printed wiring board.

This method is a method that a pulse signal or step signal is transmitted to a transmission circuit composed of a signal circuit (circuit to be measured), which is an object of impedance measurement, and a reference ground circuit to detect a reflected signal within the transmission circuit, and a reflection coefficient found from the reflected signal is used to find an impedance value (characteristic impedance) of the transmission circuit (circuit to be measured).

In such a TDR method, a probe is used as an intervenor for electrically connecting a cable drawn out of a signal-transmitting source to the transmission circuit upon transmission of a signal to the transmission circuit.

Such impedance-measuring probes are roughly divided into those of 2 structures of a macrostrip structure formed by separately equipped with a contact pin for circuit to be measured for being brought into contact with a circuit to be measured and a contact pin for ground circuit for being brought into contact with a ground circuit and holding a plate-like dielectric layer between the contact pin for circuit to be measured and the contact pin for ground circuit, and a coaxial line structure formed by arranging an inner conductor and an outer conductor in a coaxial line form, drawing a contact pin for circuit to be measured out of the inner conductor and drawing a contact pin for ground circuit out of the outer conductor.

In such impedance-measuring probes, in any structure, the impedance measurement is conducted by bringing a leading end of the contact pin for circuit to be measured and a leading end of the contact pin for ground circuit into simultaneous contact with a signal circuit, which is a circuit to be measured, and a ground circuit, respectively.

In the conventional impedance-measuring probes, however, a conduction state is created by pressing the pointed contact pins against the signal circuit and ground circuit of a printed wiring board, so that the printed wiring board may be damaged upon measurement of its impedance.

In addition, since the contact pins made of a metal are brought into contact with the signal circuit and ground circuit of the printed wiring board, there is a problem that reliability on measurement is low in that a contact state between the impedance-measuring probe and the printed wiring board is unstable. It has thus been difficult to exactly measure impedance by the conventional impedance-measuring probe.

Operating clock frequencies of instruments for being connected to a computer are expected to become higher from now on, and electronic parts are considered to be fabricated more finely and at a higher density. Attending on this fact, it is considered that importance of exactly measuring characteristic impedance for surely retaining the quality of printed wiring boards increases more. However, there is a possibility that the conventional impedance-measuring probes may not sufficiently cope with such a demand.

On the other hand, as disclosed in, for example, Japanese Patent Application Laid-Open No. 183974/1991, it has heretofore been conducted to use an anisotropically conductive sheet as a member for achieving electrical connection in electrical inspection of printed wiring boards because contact stability is achieved, and moreover the printed wiring board can be prevented from being damaged upon contact, and to arrange this anisotropically conductive sheet between the printed wiring board and inspection electrodes to achieve a contact and conduction state.

However, the conventionally known anisotropically conductive sheets have involved such problems that a transmission loss becomes great when they are used in a high-frequency region, and so they have been unable to bring about sufficient properties in the impedance measurement in the high-frequency region, and have undergone difficulty in use in practice.

DISCLOSURE OF THE INVENTION

[Problems to be Solved by the Invention]

The present invention has been made on the basis of the foregoing circumstances and has as its first object the provision of an anisotropically conductive sheet usable for impedance measurement in a high-frequency region of at least 1 GHz, particularly a high-frequency region of at least 10 GHz.

A second object of the present invention is to provide an impedance-measuring probe, which can prevent a board to be measured from being damaged upon impedance measurement and can achieve high reliability on measurement in a high-frequency region of at least 1 GHz, particularly a high-frequency region of at least 10 GHz.

[Means for Solving the Problems]

In a first aspect of the present invention, there is provided an anisotropically conductive sheet formed by containing conductive particles exhibiting magnetism in a sheet base composed of an elastic polymeric substance in a state dispersed in a plane direction and oriented so as to align in a thickness-wise direction, wherein a thickness thereof is 10 to 100 µm, a number average particle diameter of the conductive particles exhibiting magnetism is 5 to 50 µm, a ratio $W_1/D$ of the thickness $W_1$ to the number average particle diameter D of the conductive particles exhibiting magnetism is 1.1 to 10, a content of the conductive particles exhibiting magnetism is 10 to 40% in terms of a weight fraction, and the sheet is used for impedance measurement in a high-frequency region.

In the anisotropically conductive sheet according to the first aspect of the present invention, a conductive substance exhibiting no magnetism may preferably be contained in a uniformly dispersed state.

In a second aspect of the present invention, there is provided an anisotropically conductive sheet comprising, in a sheet base composed of an elastic polymeric substance, a plurality of conductive parts each containing conductive particles exhibiting magnetism at a high density and extending in a thickness-wise direction of the sheet base and an insulating part mutually insulating these conductive parts wherein a thickness of the conductive parts is 10 to 100 µm, a number average particle diameter of the conductive particles exhibiting magnetism is 5 to 50 µm, a ratio $W_2/D$ of the thickness $W_2$ of the conductive part to the number average particle diameter D of the conductive particles exhibiting magnetism is 1.1 to 10, a content of the conductive particles exhibiting magnetism in the conductive part is 10 to 40% in terms of a weight fraction, and the sheet is used for impedance measurement in a high-frequency region.

In the anisotropically conductive sheet according to the second aspect of the present invention, a conductive substance exhibiting no magnetism may preferably be contained in the conductive parts and the insulating part in a uniformly dispersed state.

In the anisotropically conductive sheet according to the second aspect of the present invention, the conductive part, which is connected to a circuit to be measured of a board to be measured, and the conductive part, which is connected to a ground circuit of the board to be measured, in an impedance-measuring probe may be separated from each other by the insulating part.

In a further aspect of the present invention, there is provided an impedance-measuring probe comprising any one of the anisotropically conductive sheets described above, wherein the probe is used in a high-frequency region.

[Mode for Carrying out the Invention]

The modes for carrying out the present invention will hereinafter be described in detail.

The anisotropically conductive sheets according to the present invention are anisotropically conductive sheets used in measurement of impedance in a high-frequency region and composed of conductive particles exhibiting magnetism (hereinafter also referred to as "magnetic conductive particles") and a base formed of an elastic polymeric substance.

Specifically, they are anisotropically conductive sheets having the following respective constructions (1) and (2).

(1) An anisotropically conductive sheet (hereinafter also referred to as "first anisotropically conductive sheet") formed by containing magnetic conductive particles in a sheet base composed of an elastic polymeric substance in a state dispersed in a plane direction and oriented so as to align in a thickness-wise direction.

(2) An anisotropically conductive sheet (hereinafter also referred to as "second anisotropically conductive sheet") comprising, in a sheet base composed of an elastic polymeric substance, a plurality of conductive parts each containing magnetic conductive particles at a high density and extending in a thickness-wise direction of the sheet base and an insulating part mutually insulating these conductive parts.

The magnetic conductive particles making up the anisotropically conductive sheets according to the present invention are required to have a number average particle diameter of 5 to 50 µm.

The number average particle diameter of the magnetic conductive particles is preferably 6 to 30 µm, more preferably 8 to 20 µm.

The term "number average particle diameter of the magnetic core particles" as used herein means a value measured by a laser diffraction scattering method.

When the number average particle diameter of the magnetic conductive particles is 5 µm or greater, a portion containing such magnetic conductive particles in the resulting anisotropically conductive sheet is easy to be deformed under pressure, and in a production process thereof, the magnetic conductive particles are easy to be oriented by an orienting treatment by a magnetic field. Therefore, the resulting anisotropically conductive sheet comes to have high anisotropy. In particular, the anisotropically conductive sheet containing the magnetic conductive particles in the sheet base in a state dispersed uniformly in a plane direction of the sheet base has good resolving ability (insulating property between inspection electrodes for impedance measurement adjoining in a lateral direction upon conduction under pressure).

When the number average particle diameter of the magnetic conductive particles is 50 µm or smaller on the other hand, the resulting anisotropically conductive sheet comes to have good elasticity. In particular, in the second anisotropically conductive sheet, fine conductive parts can be easily formed.

As the magnetic conductive particles, those having a saturation magnetization of preferably at least 0.1 $Wb/m^2$, more preferably at least 0.3 $Wb/m^2$, particularly preferably at least 0.5 $Wb/m^2$ may be used from the viewpoint of the fact that such magnetic conductive particles can be easily moved by the effect of a magnetic field in a molding material for forming the anisotropically conductive sheet by a production process, which will be described subsequently.

The saturation magnetization is at least 0.1 $Wb/m^2$, whereby the magnetic conductive particles can be surely moved into a desired oriented state by the effect of a magnetic field in the production process to form chains of the magnetic conductive particles upon use of the anisotropically conductive sheet.

Specific examples of such magnetic conductive particles include particles of metals exhibiting magnetism, such as iron, nickel and cobalt, particles of alloys thereof, particles containing such a metal, composite particles obtained by using these particles as core particles and plating surfaces of the core particles with a high-conductive metal, composite particles obtained by using particles of a non-magnetic metal, particles of an inorganic substance, such as glass beads, or particles of a polymer as core particles and plating surfaces of the core particles with a high-conductive metal, and composite particles obtained by coating the core particles with both conductive magnetic substance such as ferrite or intermetallic compound, and high-conductive metal.

The term "high-conductive metal" as used herein means a metal having an electric conductivity of at least $5 \times 10^6$ $\Omega^{-1} m^{-1}$ at 0 C.°.

As such a high-conductive metal, may be specifically used gold, silver, rhodium, platinum, chromium or the like. Among these, gold is preferably used in that it is chemically stable and has a high electric conductivity.

Among these magnetic conductive particles, composite particles obtained by using nickel particles as core particles and plating the surfaces thereof with a high-conductive metal such as gold or silver are preferred.

No particular limitation is imposed on a means for coating the surfaces of the core particles with the high-conductive metal. However, for example, electroless plating may be used.

The magnetic core particles preferably have a coefficient of variation of number average particle diameter of at most 50%, more preferably at most 40%, still more preferably at most 30%, particularly preferably at most 20%.

In the present invention, the coefficient of variation of number average particle diameter is a value determined in accordance with the expression: $(\sigma/Dn) \times 100$, wherein $\sigma$ is a standard deviation value of the particle diameter, and Dn is a number average particle diameter of the particles.

When the coefficient of variation of number average particle diameter of the magnetic conductive particles is 50% or lower, a scatter of conductivity of a portion containing the magnetic conductive particles in the resulting anisotropically conductive sheet can be made narrow because the degree of unevenness of particle diameter is low.

Such magnetic conductive particles can be obtained by forming particles from a metallic material in accordance with a method known per se in the art, or providing commercially available metal particles, and subjecting the particles to a classification treatment.

The classification treatment of the particles can be conducted by means of, for example, a classifier such as an air classifier or sonic classifier.

Specific conditions for the classification treatment are suitably preset according to the intended number average particle diameter of the conductive metal particles, the kind of the classifier, and the like.

No particular limitation is imposed on the specific shape of the magnetic conductive particles. However, as particles having a preferable shape, may be mentioned those having a shape formed of secondary particles obtained by integrally linking a plurality of spherical primary particles.

When the composite particles (hereinafter also referred to as "conductive composite metal particles") obtained by coating the surfaces of the core particles with the high-conductive metal are used as the magnetic conductive particles, the coating rate (proportion of an area coated with the high-conductive metal to the surface area of the core particles) of the high-conductive metal on the surfaces of the conductive composite metal particles is preferably at least 40%, more preferably at least 45%, particularly preferably 47 to 95% from the viewpoint of achieving good conductivity.

The coating amount of the high-conductive metal is preferably 2.5 to 50% by mass, more preferably 3 to 45% by mass, further preferably 3.5 to 40% by mass, particularly preferably 5 to 30% by mass based on the weight of the core particles.

In the conductive composite metal particles, the thickness t of the coating layer formed of the high-conductive metal, which is calculated out in accordance with the following equation, is preferably at least 10 nm, more preferably 10 to 100 nm.

$$t=[1/(Sw \cdot \rho)] \times [N/(1-N)] \quad \text{[Equation 1]}$$

wherein t is the thickness (m) of the coating layer, Sw is a BET specific surface area (m²/kg) of the conductive composite metal particles, $\rho$ is a specific gravity (kg/m³) of the high-conductive metal, and N is a coating rate (weight of the high-conductive metal forming the coating layer/weight of the conductive composite metal particles) of the coating layer.

When the thickness t of the coating layer is at least 10 nm, such conductive composite metal particles come to have high conductivity, and an anisotropically conductive sheet making use of the conductive composite metal particles as the magnetic conductive particles becomes one seldom causes decrease of the conductivity due to separation of the coating layer by temperature change, pressurization or the like.

The conductive composite metal particles may be those obtained by treating surfaces thereof with a coupling agent such as a silane coupling agent.

By treating the surfaces of the conductive composite metal particles with the coupling agent, the adhesion property of the conductive composite metal particles to the elastic polymeric substance is enhanced. As a result, the resulting anisotropically conductive sheet comes to have high durability.

The amount of the coupling agent used is suitably selected within limits not affecting the conductivity of the conductive composite metal particles themselves. However, it is preferably such an amount that a coating proportion (proportion of an area coated with the coupling agent to the surface area of the conductive composite metal particles themselves) of the coupling agent on the surfaces of the conductive composite metal particles amounts to at least 5%, more preferably 7 to 100%, still more preferably 10 to 100%, particularly preferably 20 to 100%.

In the first anisotropically conductive sheet, a content of the magnetic conductive particles is preferably 10 to 40%, particularly preferably 15 to 30% in terms of a weight friction.

If the content of the magnetic conductive particles is lower than 10%, the anisotropically conductive sheet makes it difficult to achieve low inductance characteristic in the measurement system in impedance measurement, and particularly to lower a transmission loss in impedance measurement in a high-frequency region of at least 1 GHz.

If the content of the magnetic conductive particles exceeds 40% on the other hand, the anisotropically conductive sheet becomes low in elasticity and is liable to be brittle and it tends to damage a board to be measured, such as a printed wiring board upon impedance measurement.

In the second anisotropically conductive sheet, a content of the magnetic conductive particles in the conductive parts is preferably 10 to 40%, particularly preferably 15 to 30% in terms of a weight friction.

If the content of the magnetic conductive particles is lower than 10%, the anisotropically conductive sheet makes it difficult to achieve low inductance characteristic in the measurement system in impedance measurement, and particularly to lower a transmission loss in impedance measurement in a high-frequency region of at least 1 GHz.

If the content of the magnetic conductive particles exceeds 40% on the other hand, the conductive parts of the anisotropically conductive sheet become low in elasticity and are liable to be brittle and they tend to damage a board to be measured, such as a printed wiring board upon impedance measurement.

The elastic polymeric substance forming the sheet base of the anisotropically conductive sheets according to the present invention is preferably a cured product of liquid rubber. As such liquid rubber, may be used liquid silicone rubber, liquid polyurethane rubber or the like. Among these, liquid silicone rubber is preferred.

The liquid silicone rubber as a polymeric substance-forming material preferably has a viscosity not higher than $10^5$ poises as measured at a shear rate of $10^{-1}$ sec and may be any of condensation type, addition type and those having a vinyl group or hydroxyl group.

As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reactions in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization used herein, may be used an alkali such as tetramethylammonium hydroxide or n-butyl-phosphonium hydroxide, or a silanolate solution thereof. The reaction is conducted at a temperature of, for example, 80 to 130° C.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reactions in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosiloxane, methyldihydrochloro-silane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butyl-phosphonium hydroxide or a silanolate solution thereof. The reaction is conducted at a temperature of, for example, 80 to 130° C.

Such an elastic polymeric substance preferably has a molecular weight Mw (weight average molecular weight as determined in terms of standard polystyrene) of 10,000 to 40,000.

It also preferably has a molecular weight distribution index (a ratio Mw/Mn of weight average molecular weight Mw as determined in terms of standard polystyrene to number average molecular weight Mn as determined in terms of standard polystyrene) of at most 2 from the viewpoint of the heat resistance of the resulting first anisotropically conductive sheet.

A curing catalyst for curing the polymeric substance-forming material may be contained in a sheet-molding material, which contains the polymeric substance-forming material and the magnetic conductive particles, for providing the anisotropically conductive sheets according to the present invention and for forming the anisotropically conductive sheets in accordance with production processes, which will be described subsequently.

As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of the catalyst for hydrosilylation reaction, which may be used as the curing catalyst, include publicly known catalysts such as platinic chloride and salts thereof, platinum-unsaturated group-containing siloxane complexes, vinylsiloxane-platinum complexes, complexes of platinum and 1,3-divinyltetramethyldisiloxane, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

The anisotropically conductive sheets according to the present invention may contain a conductive substance (hereinafter also referred to as "non-magnetic conductive substance") exhibiting no magnetism.

Specifically, in the first anisotropically conductive sheet, the non-magnetic conductive substance is contained in a uniformly dispersed state, and in the second anisotropically conductive sheet, it is contained in a state uniformly dispersed in the conductive parts and insulating part making up the second anisotropically conductive sheet.

The non-magnetic conductive substance may be contained in a state uniformly dispersed in both plain direction and thickness-wise direction in the anisotropically conductive sheet thus obtained by molding by adding it to the polymeric substance-forming material prior to the curing treatment.

Such a non-magnetic conductive substance is added in a proper amount, whereby the resulting anisotropically conductive sheet exhibits an effect to prevent it from being charged without impairing its anisotropical conductivity.

When the anisotropically conductive sheet is prevented from being charged by the effect of the non-magnetic conductive substance, it can prevent adverse effect on measured results resulting from the charging of the anisotropically conductive sheet when measurements of impedance using the anisotropically conductive sheet is repeatedly conducted.

As the non-magnetic conductive substance, may be used a substance (hereinafter also referred to as "self-conductive substance") exhibiting conductivity by itself, a substance (hereinafter also referred to as "hygroscopic conductive substance") developing conductivity by moisture absorption, or the like.

The self-conductive substance may be generally selected for use from among substances exhibiting conductivity by metallic bond, substances that charge transfer occurs by transfer of excess electrons, substances that charge transfer occurs by transfer of holes, substances that an ion is formed, and an electric charge is transferred by the ion, substances which have π bonds along a main chain and exhibit conductivity by interaction thereof, substances which cause charge transfer by interaction of groups present on side chains, etc.

Specific examples of self-conductive substances usable include particles of metals including platinum, gold, silver, copper, nickel, cobalt, iron, aluminum, manganese, zinc, tin, lead, indium, molybdenum, niobium, tantalum, chromium, etc.; conductive metal oxides such as copper dioxide, zinc oxide and tin oxide; whiskers of potassium titanate and the like; semiconductive substances such as germanium, silicon, indium phosphide and zinc sulfide; carbonaceous substances such as carbon black and graphite; substances forming a cation, such as quaternary ammonium salts and amine compounds; substances forming an anion, such as aliphatic sulfonates, salts of higher alcohol sulfates, salts of ethylene oxide-added higher alcohol sulfates, salts of higher alcohol phosphates and salts of ethylene oxide-added higher alcohol phosphates; substances forming both cation and anion, such as betaines; and conductive polymeric substances such as polyacetylene type polymers, acrylic polymers, polyphenylene type polymers, heterocyclic polymers, rudder polymers, network polymers and ionic polymers.

The substances forming an ion exemplified as a kind of the self-conductive substances may be named generically surfactants.

In the polymers such as the polyacetylene type polymers, acrylic polymers, polyphenylene type polymers, rudder polymers and network polymers, their conductivity may be controlled by doping them with a metal ion or the like.

In general, the hygroscopic conductive substances are preferably substances having high hygroscopicity and a hydroxyl group, ester group or the like that is high in polarity.

Specific examples include silicon compounds such as polychlorosiloxane, alkoxysilanes, polyalkoxysilanes and polyalkoxysiloxanes; polymeric substances such as conductive urethane, polyvinyl alcohol and copolymers thereof; alcoholic surfactants such as higher alcohol ethylene oxides, polyethylene glycol fatty acid esters and polyhydric alcohol fatty acid esters; and polysaccharides.

Among the non-magnetic conductive substance described above, the aliphatic sulfonates may be mentioned as preferred substances.

Of the aliphatic sulfonates, a metal salt of an alkylsulfonic acid is particularly preferably used. In this case, moderate conductivity is imparted to the resulting anisotropically conductive sheet to achieve a good antistatic effect, and moreover a stable antistatic effect is achieved even when the resulting anisotropically conductive sheet is used repeatedly in impedance measurement in a high-frequency region, since the metal salt of the alkylsulfonic acid has excellent heat stability.

As the metal salt of the alkylsulfonic acid, is preferred an alkali metal salt.

Specific examples of the alkali metal salt include sodium 1-decanesulfonate, sodium 1-undecanesulfonate, sodium 1-dodecanesulfonate, sodium 1-tridecanesulfonate, sodium 1-tetradecanesulfonate, sodium 1-pentadecane-sulfonate, sodium 1-hexadecanesulfonate, sodium 1-heptadecanesulfonate, sodium 1-octadecanesulfonate, sodium 1-nonadecanesulfonate, sodium 1-eicosanedecasulfonate, potassium 1-decanesulfonate, potassium 1-undecanesulfonate, potassium 1-dodecanesulfonate, potassium 1-tridecane-sulfonate, potassium 1-tetradecanesulfonate, potassium 1-pentadecanesulfonate, potassium 1-hexadecanesulfonate, potassium 1-heptadecanesulfonate, potassium 1-octadecane-sulfonate, potassium 1-nonadecanesulfonate, potassium 1-eicosanedecasulfonate, lithium 1-decanesulfonate, lithium 1-undecanesulfonate, lithium 1-dodecanesulfonate, lithium 1-tridecanesulfonate, lithium 1-tetradecanesulfonate, lithium 1-pentadecanesulfonate, lithium 1-hexadecane-sulfonate, lithium 1-heptadecanesulfonate, lithium 1-octadecanesulfonate, lithium 1-nonadecanesulfonate, lithium 1-eicosanedecasulfonate and isomers thereof.

Among these compounds, the sodium salts are particularly preferred in that they are excellent in heat resistance.

These compounds may be used in any combination thereof.

The amount of the metal salt of the alkylsulfonic acid added is preferably within a range of 0.1 to 30% by mass based on the polymeric substance forming the sheet base.

The reason for it is that if the content of the metal salt of the alkylsulfonic acid is lower than 0.1% by mass, the antistatic effect in the resulting anisotropically conductive sheet may become low in some cases. If the content exceeds 30% by mass on the other hand, the mechanical strength of the resulting anisotropically conductive sheet may be lowered, and, especially in the second anisotropically conductive sheet, the electric conductivity of the insulating part located between conductive parts adjacent to each other may become high to make insulating property between both conductive parts insufficient in some cases. It is hence not preferable to use the metal salt of the alkylsulfonic acid in such too low or high content.

In the sheet-molding material, may be contained a general inorganic filler such as silica powder, colloidal silica, aerogel silica, alumina or diamond powder as needed.

By moderately containing such an inorganic filler, the thixotropic property of the sheet-molding material is ensured, the viscosity thereof becomes high, the dispersion stability of the magnetic conductive particles is improved, and moreover the strength of the resulting anisotropically conductive sheet becomes high. In addition, the surface hardness of the anisotropically conductive sheet is moderately improved, whereby the anisotropically conductive sheet can achieve an effect that durability upon repeated use in impedance measurement is improved.

No particular limitation is imposed on the amount of such an inorganic filler used. However, the use in a large amount is not preferred because the oriented state of the magnetic conductive particles by a magnetic field cannot be made a desired state.

The viscosity of the sheet-molding material is preferably within a range of from 100,000 to 1,000,000 cp at a temperature of 25° C.

FIG. 1 is a cross-sectional view illustrating the construction of an exemplary anisotropically conductive sheet according to the first aspect of the present invention.

The first anisotropically conductive sheet 10 is formed by containing magnetic conductive particles P in a sheet base composed of an elastic polymeric substance in a state uniformly dispersed in a plane direction of the sheet base and oriented in a thickness-wise direction thereof.

Such first anisotropically conductive sheet 10 can be produced, for example, in the following process.

A flowable sheet-molding material with magnetic conductive particles P and a non-magnetic conductive substance, which is optionally used, dispersed in a polymeric substance-forming material, which will become a sheet base by a curing treatment, is first prepared, and the sheet-molding material is filled into a mold 20 as illustrated in FIG. 2, thereby forming a sheet-molding material layer 10A.

The mold 20 used herein is so constructed that a top force 21 and a bottom force 22 each composed of a rectangular ferromagnetic substance plate are arranged so as to be opposed to each other through a rectangular frame-like spacer 23, and a cavity is formed between a lower surface of the top force 21 and an upper surface of the bottom force 22.

For example, electromagnets or permanent magnets are then arranged on an upper surface of the top force 21 and a lower surface of the bottom force 22 to apply a parallel magnetic field to the sheet-molding material layer 10A within the mold 20 in a thickness-wise direction thereof. As a result of this orienting treatment by the magnetic field, in the sheet-molding material layer 10A, the magnetic conductive particles P dispersed in the sheet-molding material layer are oriented so as to align in the thickness-wise direction while retaining the state dispersed in the plane direction as illustrated in FIG. 3.

When the non-magnetic conductive substance is contained in the sheet-molding material layer 10A, the non-magnetic conductive substance remains dispersed in the sheet-molding material layer 10A even when the parallel magnetic field is applied.

In this state, the sheet-molding material layer 10A is subjected to a curing treatment, thereby producing fiest anisotropically conductive sheet 10 containing the magnetic conductive particles P in the sheet base composed of the insulating elastic polymeric substance in a state oriented so as to align in the thickness-wise direction.

In the production process described above, the intensity of the parallel magnetic field applied to the sheet-molding material layer 10A is preferably an intensity that it amounts to 0.02 to 1.5 T on the average.

When the parallel magnetic field is applied to the sheet-molding material layer 10A in the thickness-wise direction thereof by permanent magnets, as such permanent magnets, are preferably used those composed of alunico (Fe—Al—Ni—Co alloy), ferrite or the like in the view that the parallel magnetic field of the above described range is achieved.

The curing treatment of the sheet-molding material layer 10A may be conducted in the state that the parallel magnetic field is applied. However, the treatment may also be conducted after stopping the application of the parallel magnetic field.

The curing treatment of the sheet-molding material layer 10A is suitably selected according to the materials used. However, the treatment is generally conducted by a heat treatment. Specific heating temperature and heating time are suitably selected in view of the kinds of the polymeric substance-forming material forming the sheet-molding material layer 10A, the time required for movement of the magnetic conductive particles P, and the like.

The first anisotropically conductive sheet is required to have a thickness of 10 to 100 µm.

If the thickness is smaller than 10 µm, such an anisotropically conductive sheet comes to have low elasticity and is thus liable to damage an object to be inspected, such as a printed wiring board when this anisotropically conductive sheet is arranged between the object to be inspected and inspection electrodes to achieve a contact and conduction state by applying pressure.

If the thickness exceeds 100 µm on the other hand, a distance between the object to be inspected, such as the printed wiring board and the inspection electrodes becomes great, so that a transmission loss is hard to lower in impedance measurement in a high-frequency region, specifically a high-frequency region of at least 1 GHz when this anisotropically conductive sheet is arranged between the object to be inspected and the inspection electrodes to achieve a contact and conduction state by applying pressure.

In the first anisotropically conductive sheet 10, a ratio $W_1/D$ of the thickness $W_1$ (µm) to the number average particle diameter D (µm) of the magnetic conductive particles is required to be 1.1 to 10.

If the ratio $W_1/D$ is lower than 1.1, the diameter of the magnetic conductive particles is equivalent to or greater than the thickness of the anisotropically conductive sheet, so that the anisotropically conductive sheet comes to have low elasticity and is thus liable to damage an object to be inspected, such as a printed wiring board when this anisotropically conductive sheet is arranged between the object to be inspected and inspection electrodes to achieve a contact and conduction state by applying pressure.

If the ratio $W_1/D$ exceeds 10 on the other hand, a great number of the conductive particles are arranged between an object to be inspected, such as a printed wiring board, and inspection electrodes to form chains when this anisotropically conductive sheet is arranged between the object to be inspected and the inspection electrodes to achieve a contact and conduction state by applying pressure. Therefore, a great number of contacts among the conductive particles are present, so that a transmission loss is hard to lower in impedance measurement in a high-frequency region, specifically a high-frequency region of at least 1 GHz.

FIG. 4 is a cross-sectional view illustrating the construction of an exemplary anisotropically conductive sheet according to the second aspect of the present invention.

The second anisotropically conductive sheet 40 comprises, in a sheet base composed of an elastic polymeric substance, a plurality of conductive parts 11 containing magnetic conductive particles at a high density and extending in a thickness-wise direction, and an insulating part 12 mutually insulating these conductive parts 11 and formed by the sheet base composed of the elastic polymeric substance.

In this embodiment illustrated, the conductive parts 11 are formed in a state projected from both surfaces of the insulating part 12.

Such second anisotropically conductive sheet 40 can be produced, for example, in the following manner.

FIG. 5 is a cross-sectional view illustrating the construction of an exemplary mold used for producing the second anisotropically conductive sheet 40.

This mold is so constructed that a top force 50 and a bottom force 55 making a pair therewith are arranged so as to be opposed to each other through a frame-like spacer 54, and a cavity is formed between a lower surface of the top force 50 and an upper surface of the bottom force 55.

In the top force 50, ferromagnetic substance layers 52 are formed on a lower surface of a ferromagnetic base plate 51 in accordance with a pattern antipodal to an arrangement pattern of the conductive parts 11 of the intended anisotropically conductive sheet 40, and non-magnetic substance layers 53 having a thickness greater than that of the ferromagnetic substance layers 52 are formed at other portions than the ferromagnetic substance layers 52.

In the bottom force 55 on the other hand, ferromagnetic substance layers 57 are formed on an upper surface of a base plate 56 in accordance with the same pattern as the arrangement pattern of the conductive parts 11 of the intended anisotropically conductive sheet 40, and non-magnetic substance layers 58 having a thickness greater than that of the ferromagnetic substance layers 57 are formed at other portions than the ferromagnetic substance layers 57.

Such a mold is used, and in accordance with the same molding process as in the first anisotropically conductive sheet, a flowable sheet-molding material with magnetic conductive particles P and a non-magnetic conductive substance, which is optionally used, dispersed in a polymeric substance-forming material, which will become a sheet base by a curing treatment, is filled into the mold as illustrated in FIG. 6, thereby forming a sheet-molding material layer 40A. For example, electromagnets or permanent magnets are then arranged on an upper surface of the top force 50 and a lower surface of the bottom force 55 to apply a magnetic field to the sheet-molding material layer 40A within the mold in a thickness-wise direction thereof. As a result of this orienting treatment by the magnetic field, a magnetic field having higher intensity at portions between the ferromagnetic substance layers 52 in the top force 50 and their corresponding ferromagnetic substance layers 57 in the bottom force 55 than the other portions is applied to the sheet-molding material layer 40A as illustrated in FIG. 7, whereby the magnetic conductive particles P dispersed in the sheet-molding material layer 40A are gathered at the portions to which the magnetic field having the higher intensity is being applied. In this state, the sheet-molding material layer 40A is subjected to a curing treatment, thereby producing second anisotropically conductive sheet 40 comprising a plurality of the conductive parts 11 containing the magnetic conductive particles P at a high density in the sheet base composed of the elastic polymeric substance and extending in the thickness-wise direction, and the insulating part 12 mutually insulating these conductive parts 11.

In the second anisotropically conductive sheet 40, the conductive parts 11 are required to have a thickness of 10 to 100 µm.

If the thickness of the conductive parts 11 is smaller than 10 µm, such an anisotropically conductive sheet comes to have low elasticity and is thus liable to damage an object to be inspected, such as a printed wiring board when this anisotropically conductive sheet is arranged between the object to be inspected and inspection electrodes to achieve a contact and conduction state by applying pressure.

If the thickness of the conductive parts 11 exceeds 100 µm on the other hand, a distance between the object to be inspected, such as the printed wiring board and the inspection electrodes becomes great, so that a transmission loss is hard to lower in impedance measurement in a high-frequency region, specifically a high-frequency region of at least 1 GHz when this anisotropically conductive sheet is arranged between the object to be inspected and the inspection electrodes to achieve a contact and conduction state by applying pressure.

In the second anisotropically conductive sheet 40, a ratio $W_2/D$ of the thickness $W_2$ (µm) of the conductive parts 11 to the number average particle diameter D (µm) of the magnetic conductive particles is required to be 1.1 to 10.

If the ratio $W_2/D$ is lower than 1.1, the diameter of the magnetic conductive particles is equivalent to or greater than the thickness of the conductive parts of the anisotropically conductive sheet, so that the conductive parts of the anisotropically conductive sheet come to have low elasticity and are thus liable to damage an object to be inspected, such as a printed wiring board when this anisotropically conductive sheet is arranged between the object to be inspected and inspection electrodes to achieve a contact and conduction state by applying pressure.

If the ratio $W_2/D$ exceeds 10 on the other hand, a great number of the conductive particles are arranged between an object to be inspected, such as a printed wiring board, and inspection electrodes to form chains when this anisotropically conductive sheet is arranged between the object to be inspected and the inspection electrodes to achieve a contact and conduction state by applying pressure. Therefore, a great number of contacts among the conductive particles are present, so that a transmission loss is hard to lower in impedance measurement in a high-frequency region, specifically a high-frequency region of at least 1 GHz The anisotropically conductive sheets according to the present invention are not limited to the above-described embodiments, and various changes may be added thereto.

For example, the second anisotropically conductive sheet may be that provided with 2 conductive parts of a columnar conductive part K and a cylindrical conductive part G that has an inner diameter greater than the conductive part K and is coaxial with the conductive part K, as illustrated in FIGS. 8 and 9.

In this anisotropically conductive sheet 80, the conductive part K is a conductive part connected to a measuring circuit of an impedance-measuring probe body, and the conductive part G is a conductive part connected to a ground circuit-connecting circuit of the impedance-measuring probe body.

These conductive part K and conductive part G making up the anisotropically conductive sheet 80 contain magnetic conductive particles at a high density, and the conductive part K and the conductive part G are electrically insulated by an insulating part N.

FIG. 10 is a conceptual view illustrating an impedance-measuring probe according to the present invention, in which the anisotropically conductive sheet 80 illustrated in FIGS. 8 and 9 is provided on an impedance-measuring probe body.

This impedance-measuring probe 120 comprises an impedance-measuring probe body 120A in a columnar form as a whole, which has a columnar measuring circuit 121 and a cylindrical ground circuit-connecting circuit 122 that has an inner diameter greater than the measuring circuit 121 and is coaxial with the measuring circuit 121, and the anisotropically conductive sheet 80.

In this impedance-measuring probe 120, an end surface of the conductive part K on one side (lower surface in FIG. 10) of the anisotropically conductive sheet 80 is connected to the measuring circuit 121 of the impedance-measuring probe body 120A, and the end surface of the conductive part G on said one side is connected to the ground circuit-connecting circuit 122 of the impedance-measuring probe body 120A.

In this embodiment illustrated, the conductive part K of the anisotropically conductive sheet 80 has a diameter fitted to the measuring circuit 121, and the conductive part G has a diameter fitted to the ground circuit-connecting circuit 122.

According to the impedance-measuring probe 120 provided with this anisotropically conductive sheet 80, a surface (upper surface in FIG. 10) of the anisotropically conductive sheet 80, which is opposed to the surface connected to the impedance-measuring probe body 120, is brought into contact with a printed wiring board that is a board to be measured and pressurized, whereby a circuit to be measured of the printed wiring board is connected to the measuring circuit 121 of the impedance-measuring probe body 120A, and moreover a reference ground circuit of the printed wiring board is connected to the ground circuit-connecting circuit 122 of the impedance-measuring probe body 120A through the respective conductive parts (conductive part K and conductive part G) of the anisotropically conductive sheet 80, thereby achieving conduction to perform measurement of impedance.

DESCRIPTION OF CHARACTERS

10 Anisotropically conductive sheet,
10A Sheet-molding material layer,
11 Conductive parts,
11A Portions to which a magnetic field having higher intensity is applied,
12 Insulating part,
20 Mold,
21 Top force,
22 Bottom force,
23 Spacer,
P Magnetic conductive particles,
40 Anisotropically conductive sheet,
40A Sheet-molding material layer,
50 Top force,
51 Base plate,
52 Ferromagnetic substance layers,
53 Non-magnetic substance layers,
54 Spacer,
55 Bottom force,
56 Base plate,
57 Ferromagnetic substance layers,
58 Non-magnetic substance layers,
80 Anisotropically conductive sheet,
120 Impedance-measuring probe,
120A Impedance-measuring probe body,
121 Measuring circuit,
122 Ground circuit-connecting circuit,
K Conductive part,
G Conductive part,
N Insulating part.

BEST MODE FOR CARRYING OUT THE INVENTION

The present invention will hereinafter be described specifically by the following examples. However, the present invention is not limited to the following examples.

EXAMPLE 1

<Production of Anisotropically Conductive Sheet>

To 100 parts by mass of addition type liquid silicone rubber, "KE2000-60" (product of Shin-Etsu Chemical Co., Ltd.), were added 22.5 parts by mass of magnetic conductive particles having an number average particle diameter of 8 μm and 2.5 parts by mass of sodium alkylsulfonate ($C_nH_{2n+1}SO_3Na$ (n=12 to 20)) to mix them, thereby preparing a sheet-molding material.

In the above-described process, composite particles (average amount coated: 7% by weight of the weight of core particles) obtained by plating core particles formed of nickel with gold were used as the magnetic conductive particles.

Figure 2:
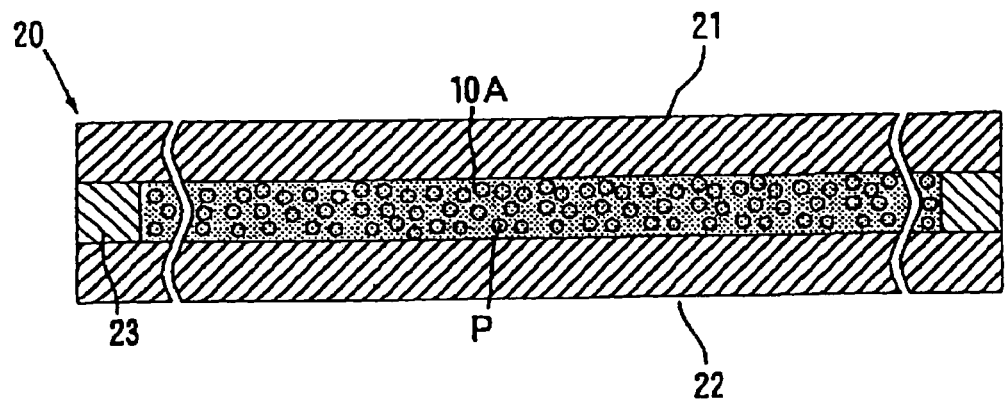
FIG. 2 is a cross-sectional view illustrating a state that a sheet-molding material layer has been formed in a mold for producing the anisotropically conductive sheet according to the first aspect of the present invention.
Figure 3:
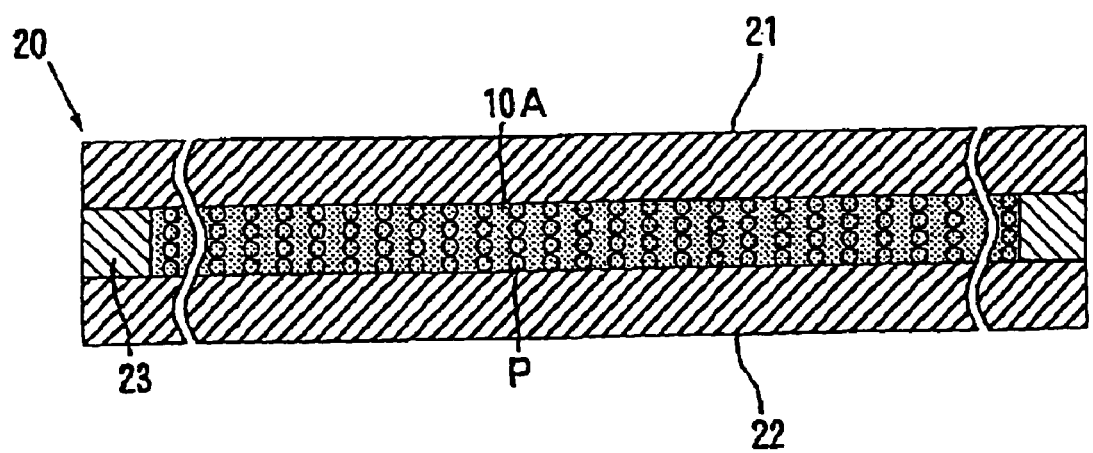
FIG. 3 is a cross-sectional view illustrating a state that a parallel magnetic field has bee applied to the sheet-molding material layer formed in the mold for producing the anisotropically conductive sheet according to the first aspect of the present invention in a thickness-wise direction thereof.
Figure 4:
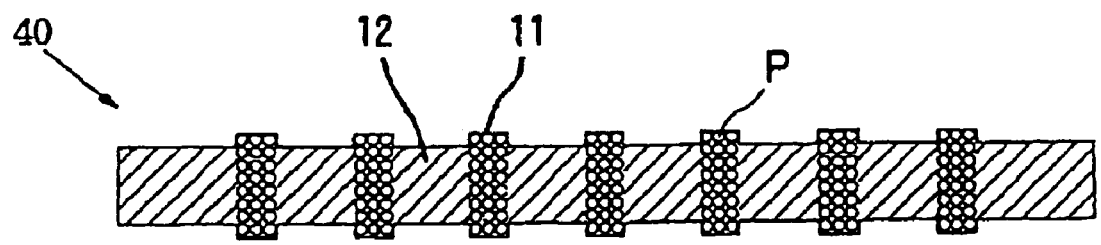
FIG. 4 is a cross-sectional view illustrating the construction of an exemplary anisotropically conductive sheet according to the second aspect of the present invention.
Figure 5:
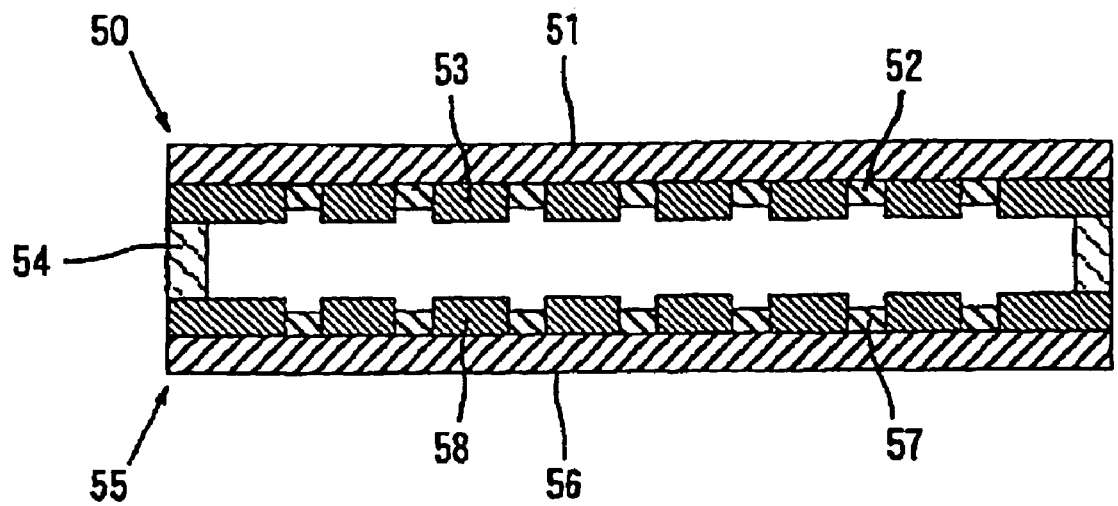
FIG. 5 is a cross-sectional view illustrating the construction of an exemplary mold for producing the anisotropically conductive sheet according to the second aspect of the present invention.
Figure 6:
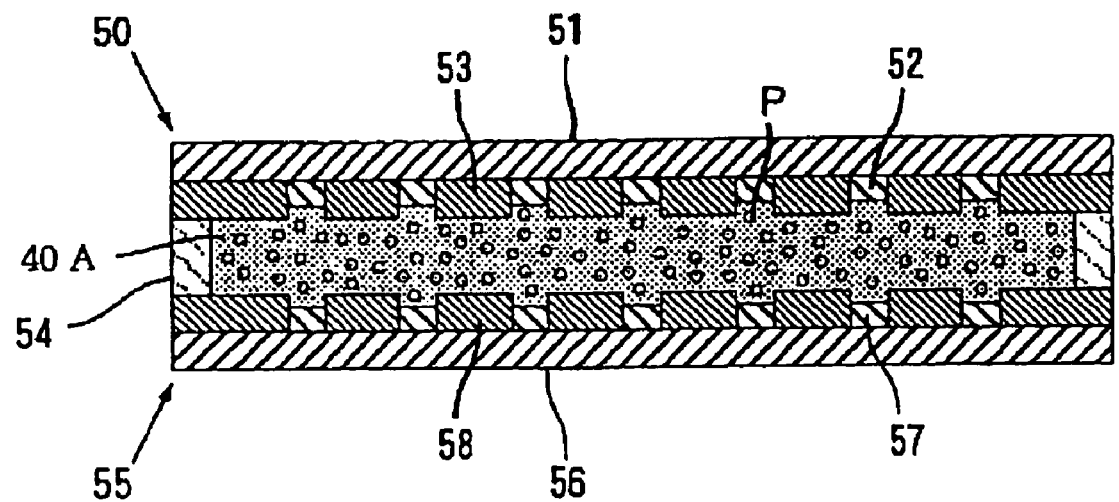
FIG. 6 is a cross-sectional view illustrating a state that a sheet-molding material layer has been formed in the mold for producing the anisotropically conductive sheet according to the second aspect of the present invention.
Figure 7:
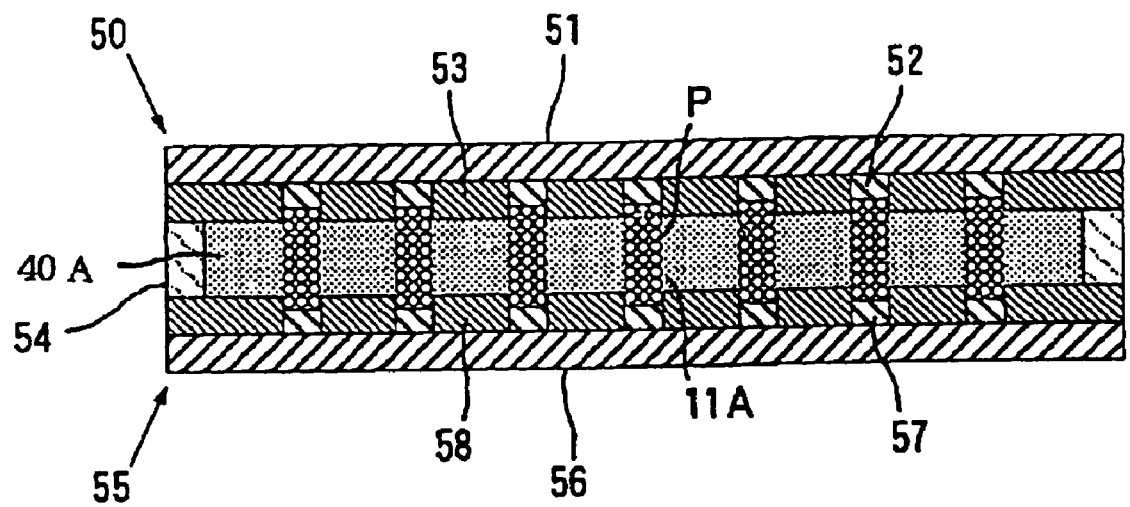
FIG. 7 is a cross-sectional view illustrating a state that a parallel magnetic field has been applied to the sheet-molding material layer formed in the mold for producing the anisotropically conductive sheet according to the second aspect of the present invention in a thickness-wise direction thereof.
Figure 8:
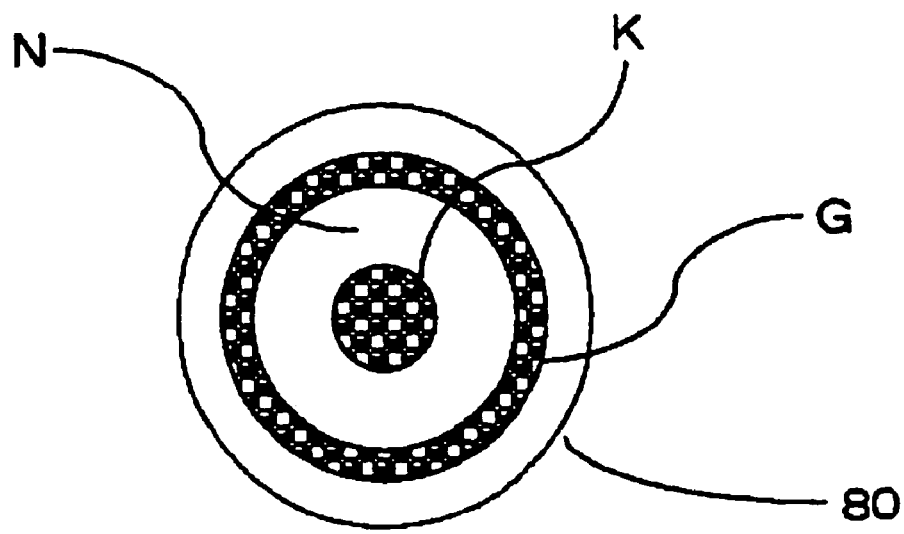
FIG. 8 is a top view illustrating a modified example of the anisotropically conductive sheet according to the second aspect of the present invention.
Figure 9:
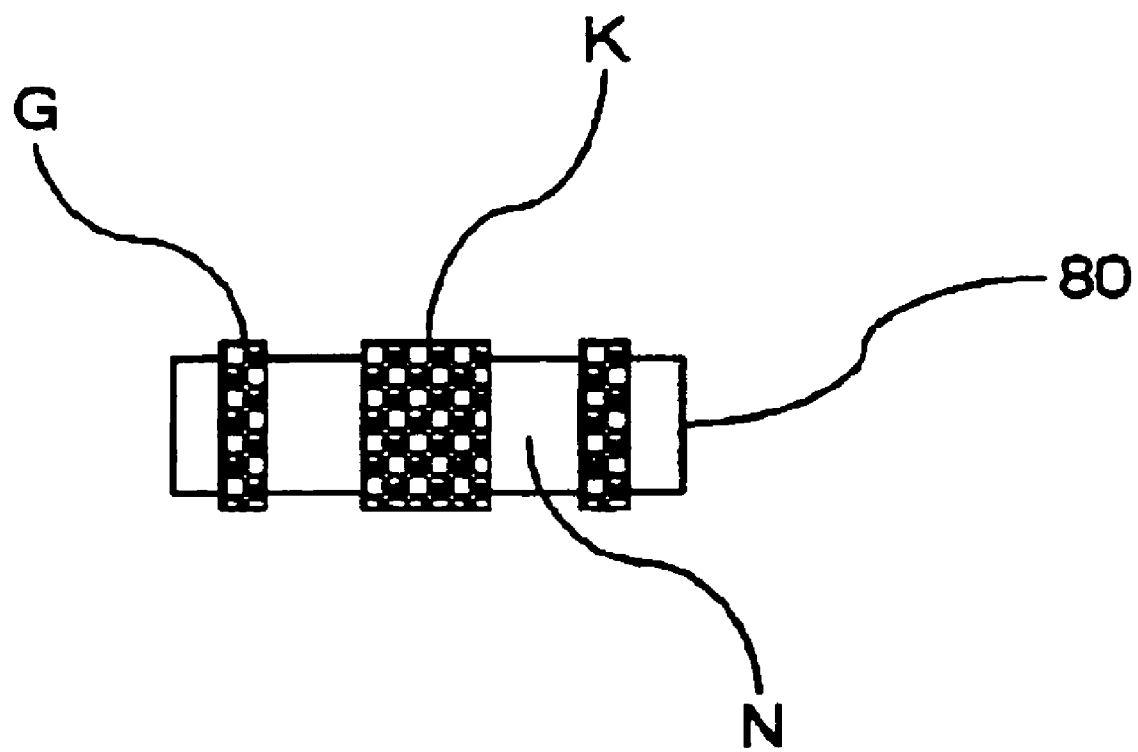
FIG. 9 is a cross-sectional view illustrating the modified example of the anisotropically conductive sheet according to the second aspect of the present invention.
Figure 10:
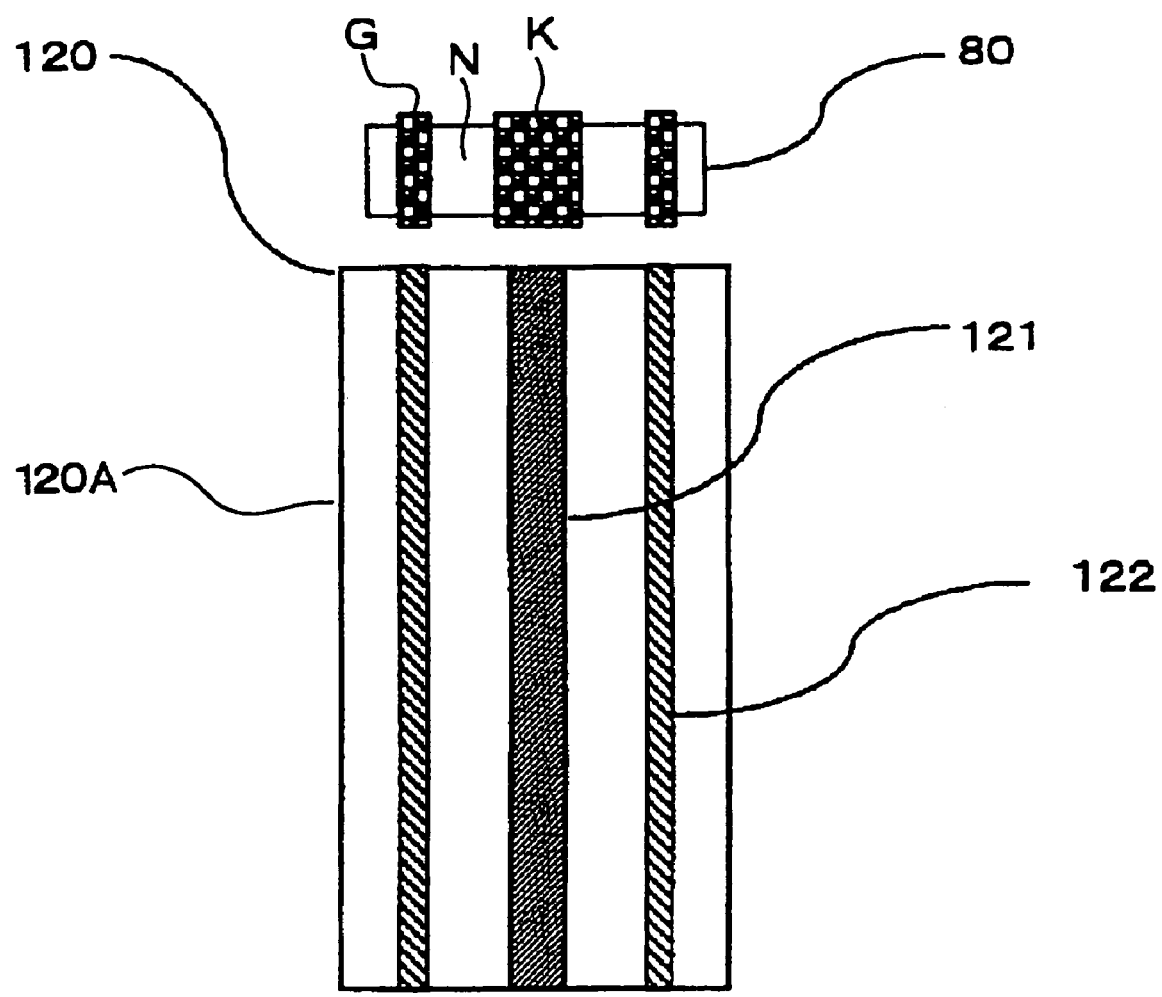
FIG. 10 is a cross-sectional view illustrating the construction of an exemplary impedance-measuring probe according to the present invention.

The sheet-molding material thus prepared was filled into a mold having the construction illustrated in FIG. 2 and equipped with a spacer having a thickness of 30 nm, thereby forming a sheet-molding material layer.

Figure 1:
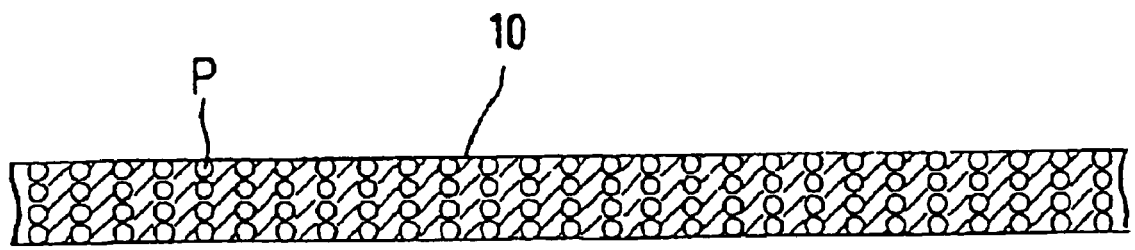
FIG. 1 is a cross-sectional view illustrating the construction of an exemplary anisotropically conductive sheet according to the first aspect of the present invention.

The sheet-molding material layer formed between a top force and a bottom force, which were each made of a ferromagnetic substance plate, was then subjected to a curing treatment under conditions of 100° C. and 1 hour while applying a parallel magnetic field of 2 T in a thickness-wise direction of the molding material layer by electromagnets, thereby producing an anisotropically conductive sheet having the construction shown in FIG. 1.

This anisotropically conductive sheet will hereinafter be referred to as "Anisotropically Conductive Sheet C1".

<Evaluation of High-frequency Properties of Anisotropically Conductive Sheet>

With respect to Anisotropically Conductive Sheet C1 thus produced, whether the anisotropically conductive sheet can be used in a high-frequency region or not was judged using, as an index, a transmission loss that is a value represented by combining inductance of a measurement system when it was used in impedance measurement, a resistance loss at a particle interface between the magnetic conductive particles forming the anisotropically conductive sheet, and the like with one another.

More specifically, a network analyzer was used to measure a transmission loss (S parameter) at a frequency of 10 GHz to 60 GHz, and the anisotropically conductive sheet was evaluated as pass where the value (S parameter) of the transmission loss measured was within a range of from −2 dB to 0 dB.

Here, when the value (S parameter) of the transmission loss was within a range of from −2 dB to 0 dB, impedance measurement of a printed wiring board or the like can be conducted in a satisfactory state. When the value was within a range of −1 dB to 0 dB, the impedance measurement can be conducted in a more satisfactory state.

When the value (S parameter) of the transmission loss is greater than −2 dB in terms of an absolute value on the other hand, it is difficult to conduct the impedance measurement.

The results are shown in Table 1. In Table 1, the value (S parameter) of the transmission loss is indicated by "○" where the value measured was within a range of from −1 dB to 0 dB, "Δ" where the value (S parameter) of the transmission loss measured was within a range of from −2 dB to 0 dB, or "x" where the value (S parameter) of the transmission loss measured was greater than −2 dB in terms of an absolute value.

Examples 2 to 10 and
Comparative Examples 1 to 8

Anisotropically Conductive Sheets C2 to C18 were produced in the same manner as in Example 1 except that the number average particle diameter of the magnetic conductive particles used, the mass of the magnetic conductive particles used, the amount of gold used in plating of the magnetic conductive particles and the thickness of the spacer making up the mold in Example 1 were respectively changed as shown in Table 1.

With respect to Anisotropically Conductive Sheets C2 to C18 thus produced, transmission losses (S parameters) were measured in the same manner as in Example 1 to evaluate the anisotropically conductive sheets as to high-frequency properties. The results are shown in Table 1.

TABLE 1

| | | Thickness | Number average particle diameter D of magentic conductive particles | Ratio | Proportion of magnetic conductive particles contained | Amount of gold plated on magnetic conductive particles | Frequency | | | | | |
|---|---|---|---|---|---|---|---|---|---|---|---|---|
| | | $W_1$ (μm) | (μm) | $W_1/D$ | (Mass %) | (Mass %) | 10 GHz | 20 GHz | 30 GHz | 40 GHz | 50 GHz | 60 GHz |
| Example 1 | Sheet C1 | 30 | 8 | 3.8 | 22.5 | 7 | ○ | ○ | ○ | ○ | ○ | ○ |
| Example 2 | Sheet C2 | 50 | 8 | 6.3 | 22.5 | 7 | ○ | ○ | ○ | ○ | ○ | ○ |
| Example 3 | Sheet C3 | 65 | 8 | 8.1 | 22.5 | 7 | ○ | ○ | ○ | ○ | ○ | Δ |
| Example 4 | Sheet C4 | 30 | 18 | 1.7 | 22.5 | 8 | ○ | ○ | ○ | ○ | ○ | ○ |
| Example 5 | Sheet C5 | 50 | 18 | 2.8 | 22.5 | 8 | ○ | ○ | ○ | ○ | ○ | ○ |
| Example 6 | Sheet C6 | 65 | 18 | 3.6 | 22.5 | 8 | ○ | ○ | ○ | ○ | ○ | Δ |
| Example 7 | Sheet C7 | 100 | 18 | 5.6 | 22.5 | 8 | ○ | ○ | ○ | ○ | Δ | Δ |
| Example 8 | Sheet C8 | 30 | 24 | 1.3 | 22.5 | 20 | ○ | ○ | ○ | ○ | ○ | ○ |
| Example 9 | Sheet C9 | 50 | 24 | 2.1 | 22.5 | 20 | ○ | ○ | ○ | ○ | ○ | ○ |
| Example 10 | Sheet C10 | 100 | 24 | 4.2 | 22.5 | 20 | ○ | ○ | ○ | Δ | Δ | Δ |
| Comparative Example 1 | Sheet C11 | 30 | 8 | 3.8 | 8 | 7 | Δ | Δ | Δ | Δ | X | X |
| Comparative Example 2 | Sheet C12 | 100 | 8 | 12.5 | 22.5 | 7 | ○ | ○ | Δ | Δ | X | X |
| Comparative Example 3 | Sheet C13 | 125 | 8 | 15.6 | 22.5 | 7 | Δ | Δ | X | X | X | X |
| Comparative Example 4 | Sheet C14 | 125 | 18 | 6.9 | 22.5 | 8 | ○ | ○ | Δ | Δ | X | X |
| Comparative Example 5 | Sheet C15 | 125 | 24 | 5.2 | 22.5 | 20 | ○ | Δ | Δ | X | X | X |
| Comparative Example 6 | Sheet C16 | 65 | 53 | 1.2 | 22.5 | 82 | Δ | Δ | Δ | Δ | X | X |
| Comparative Example 7 | Sheet C17 | 100 | 53 | 1.9 | 22.5 | 82 | Δ | Δ | Δ | Δ | X | X |
| Comparative Example 8 | Sheet C18 | 125 | 53 | 2.4 | 22.5 | 82 | X | X | X | X | X | X |

EFFECTS OF THE INVENTION

Since the anisotropically conductive sheets according to the present invention have a specific thickness and contain magnetic conductive particles having a specific number average particle diameter, they have excellent electrical properties that impedance measurement can be conducted in a state that a resistance loss is low, in the impedance measurement in a high-frequency region. In addition, since they retain sufficient elasticity, they seldom damage boards to be measured upon conduction under pressure, and durability upon repeated use is improved.

Accordingly, the anisotropically conductive sheets according to the present invention can be suitably used in impedance measurement in a high-frequency region of at least 1 GHz, particularly a high-frequency region of at least 10 GHz, and can be applied to measurement on printed wiring boards, electronic parts, etc. having a minute pitch.

Since the impedance-measuring probes according to the present invention are provided with the anisotropically conductive sheet according to the present invention, they exhibit excellent performance in a high-frequency region, specifically a high-frequency region of at least 1 GHz attributing to the low transmission loss property, damage-preventing effect to boards to be measured and good durability upon repeated use that the anisotropically conductive sheet has.

Accordingly, the impedance-measuring probes according to the present invention can prevent a board to be measured from being damaged upon impedance measurement in a high-frequency region of at least 1 GHz, particularly a high-frequency region of at least 10 GHz, and can achieve high reliability on measurement.

The invention claimed is:

1. An anisotropically conductive sheet comprising:
conductive particles exhibiting magnetism in a sheet base including an elastic polymeric substance, said conductive particles in a state dispersed in a plane direction and oriented so as to align in a thickness-wise direction, wherein
a thickness of the sheet is 10 to 100 μm, a number average particle diameter of the conductive particles exhibiting magnetism is 5 to 50 μm, a ratio $W_1/D$ of the thickness $W_1$ to the number average particle diameter D of the conductive particles exhibiting magnetism is 1.1 to 10, a content of the conductive particles exhibiting magnetism is 10 to 40% in terms of a weight fraction, and a conductive substance exhibiting no magnetism is contained in a uniformly dispersed state.

2. An anisotropically conductive sheet comprising:
a sheet base including an elastic polymeric substance;
a plurality of conductive parts in the sheet, each of the plurality including conductive particles exhibiting magnetism at a high density and extending in a thickness-wise direction of the sheet base; and
an insulating part mutually insulating these conductive parts, wherein
a thickness of the conductive parts is 10 to 100 μm, a number average particle diameter of the conductive particles exhibiting magnetism is 5 to 50 μm, a ratio $W_2/D$ of the thickness $W_2$ of the conductive part to the number average particle diameter D of the conductive particles exhibiting magnetism is 1.1 to 10, a content of the conductive particles exhibiting magnetism in the conductive part is 10 to 40% in terms of a weight fraction, and
a conductive substance exhibiting no magnetism is included in the conductive parts and the insulating part in a uniformly dispersed state.

3. The anisotropically conductive sheet according to claim 2, wherein the conductive part, which is connected to a circuit to be measured of a board to be measured, and the conductive part, which is connected to a ground circuit of the board to be measured, in an impedance-measuring probe are separated from each other by the insulating part.

4. An impedance-measuring probe comprising the anisotropically conductive sheet according to any one of claims 1, 2, or 3, wherein the probe is used in a high-frequency region.

5. The anisotropically conductive sheet according to claims 1, 2, or 3, wherein the sheet is used for impedance measurement in a high-frequency region.

* * * * *